United States Patent
Merz

(10) Patent No.: US 10,581,377 B2
(45) Date of Patent: Mar. 3, 2020

(54) METHOD FOR DETECTING ARCS, AND DETECTION APPARATUS FOR ARCS, IN A PHOTOVOLTAIC SYSTEM

(71) Applicant: SMA Solar Technology AG, Niestetal (DE)

(72) Inventor: Christopher Merz, Kassel (DE)

(73) Assignee: SMA Solar Technology AG, Niestetal (DE)

(*) Notice: Subject to any disclaimer, the term of this patent is extended or adjusted under 35 U.S.C. 154(b) by 227 days.

(21) Appl. No.: 15/454,189

(22) Filed: Mar. 9, 2017

(65) Prior Publication Data

US 2017/0179880 A1    Jun. 22, 2017

Related U.S. Application Data

(63) Continuation of application No. PCT/EP2015/069936, filed on Sep. 1, 2015.

(30) Foreign Application Priority Data

Sep. 9, 2014    (EP) .................................. 14184145

(51) Int. Cl.
*G01R 31/02* (2006.01)
*H02S 50/10* (2014.01)
(Continued)

(52) U.S. Cl.
CPC ............ *H02S 50/10* (2014.12); *G01R 31/025* (2013.01); *H01L 31/02021* (2013.01);
(Continued)

(58) Field of Classification Search
CPC ......... F21S 8/006; G01R 31/26; G01R 31/40; G01R 31/42; G01R 31/333; G01R 31/02;
(Continued)

(56) References Cited

U.S. PATENT DOCUMENTS

| 7,285,960 | B2 | 10/2007 | Koch et al. |
| 8,474,320 | B2 | 7/2013 | Kordon et al. |

(Continued)

FOREIGN PATENT DOCUMENTS

| EP | 0805355 A2 | 11/1997 |
| JP | 61082406 A | 4/1986 |

(Continued)

OTHER PUBLICATIONS

International Search Report dated Sep. 21, 2015 PCT/EP2015/069936.

*Primary Examiner* — Tung X Nguyen
*Assistant Examiner* — Robert P Alejnikov, Jr.
(74) *Attorney, Agent, or Firm* — Eschweiler & Potashnik, LLC

(57) ABSTRACT

A method and associated device for detecting arcs in a photovoltaic system with an inverter and with a plurality of current collector circuits connected in parallel with the inverter via collector lines, wherein a plurality of strings of photovoltaic modules are connected in parallel with each current collector circuit via string lines. The method includes acquiring measured values of electrical variables and analyzing the measured values of the electrical variables for the presence of signs of an arc in the photovoltaic system using an analysis circuit and generating an arc signal which indicates the presence of an arc if the analyzed measured values meet predefined criteria. The method also includes acquiring measured values of acoustic variables using one or more acoustic sensors, and analyzing the measured values of the acoustic variables for the presence of signs of an arc in the photovoltaic system using the analysis circuit.

19 Claims, 1 Drawing Sheet

(51) Int. Cl.
*H01L 31/02* (2006.01)
*H02H 7/20* (2006.01)
*H02H 1/00* (2006.01)

(52) U.S. Cl.
CPC ........ *H02H 1/0015* (2013.01); *H02H 1/0023* (2013.01); *H02H 7/20* (2013.01); *Y02E 10/56* (2013.01)

(58) Field of Classification Search
CPC .. G01R 31/021; G01R 31/12; G01R 31/1272; G01R 27/2617; H01L 22/00; H01L 31/04; H01L 51/0031; H01H 9/50; H04B 3/46
USPC ...... 324/761.01, 536, 764.01, 543, 544, 551
See application file for complete search history.

(56) References Cited

U.S. PATENT DOCUMENTS

| | | | |
|---|---|---|---|
| 9,746,528 | B2 | 8/2017 | Chaintreuil |
| 10,211,625 | B2 | 2/2019 | Sivakumar et al. |
| 2007/0057677 | A1 | 3/2007 | Koch et al. |
| 2007/0263329 | A1* | 11/2007 | Zhou .................. H01H 83/20 361/42 |
| 2008/0147335 | A1 | 6/2008 | Adest et al. |
| 2011/0141644 | A1 | 6/2011 | Hastings et al. |
| 2011/0267721 | A1* | 11/2011 | Chaintreuil ........ G01R 31/1209 361/2 |
| 2012/0006117 | A1 | 1/2012 | Kordon et al. |
| 2012/0318320 | A1 | 12/2012 | Robbins |
| 2013/0026840 | A1 | 1/2013 | Arditi et al. |
| 2014/0062500 | A1 | 3/2014 | Behrends |
| 2014/0119072 | A1 | 5/2014 | Behrends |
| 2014/0142873 | A1 | 5/2014 | Kawate |
| 2014/0191767 | A1* | 7/2014 | Zhou .................... G01R 31/04 324/538 |

FOREIGN PATENT DOCUMENTS

| | | | | |
|---|---|---|---|---|
| JP | 05223883 A | | 9/1993 | |
| JP | 2012-513738 | * | 6/2012 | ......... G01R 31/1209 |
| JP | 2013132157 A | | 7/2013 | |
| JP | 2014042364 A | | 3/2014 | |
| JP | 2014-134445 | * | 7/2014 | ............ Y02E 10/50 |
| JP | 2014134445 A | | 7/2014 | |

* cited by examiner

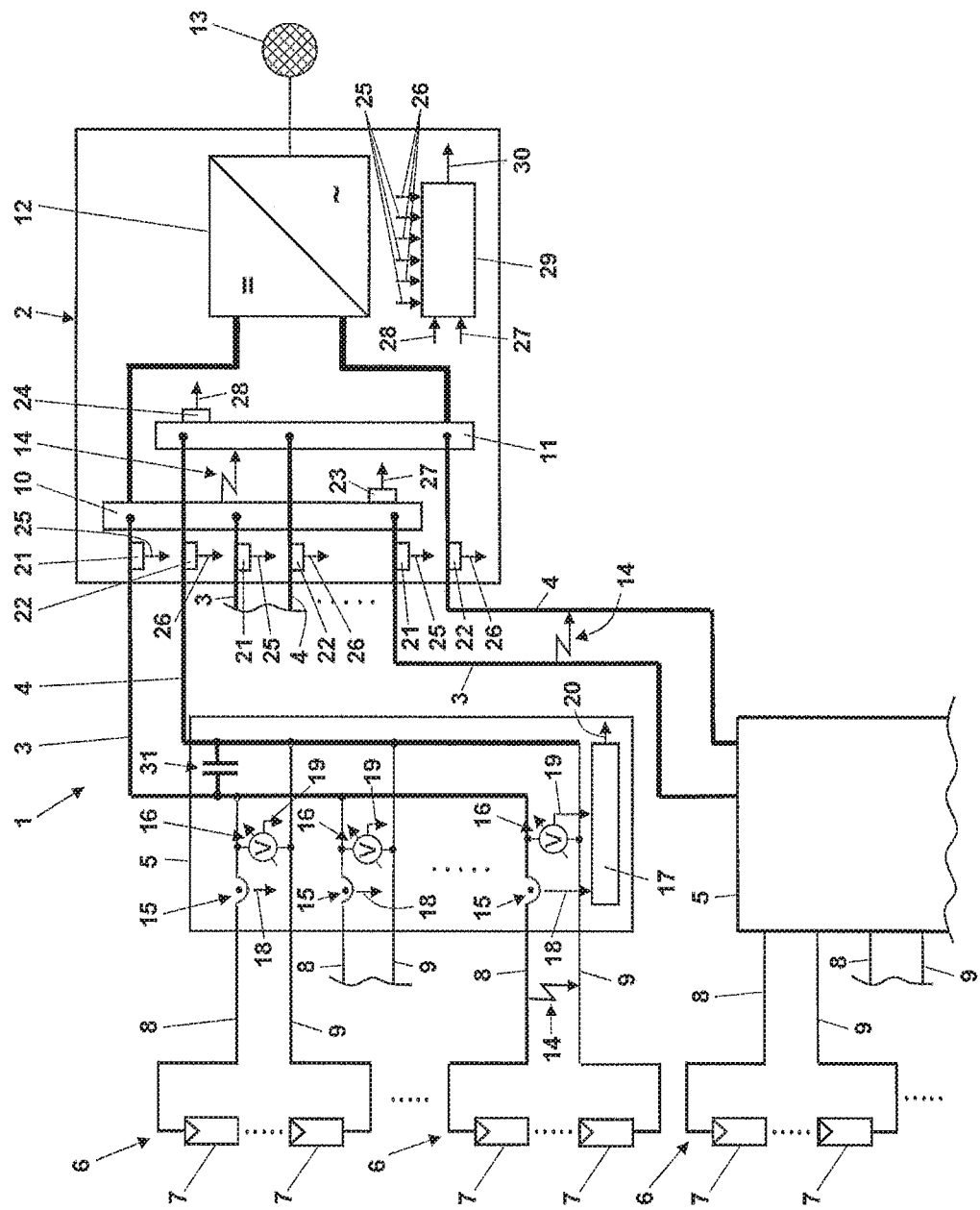

METHOD FOR DETECTING ARCS, AND DETECTION APPARATUS FOR ARCS, IN A PHOTOVOLTAIC SYSTEM

CROSS REFERENCE TO RELATED APPLICATIONS

This application claims priority to International Patent Application number PCT/EP2015/069936, filed on Sep. 1, 2015, which claims priority to European Patent Application number 14184145.2, filed on Sep. 9, 2014, and is hereby incorporated by reference in its entirety.

TECHNICAL FIELD

The disclosure relates to a method for detecting arcs in a photovoltaic system with an inverter and with a plurality of current collector circuits connected in parallel with the inverter via collector lines, wherein a plurality of strings of photovoltaic modules are connected in parallel with each current collector circuit via string lines.

BACKGROUND

The unit of the photovoltaic system which is referred to here as an inverter comprises at least one DC/AC converter which inverts the direct currents generated by the photovoltaic modules into an alternating current. Typically, the inverter comprises, in addition to the DC/AC converter, busbars to which the individual collector lines are connected directly or via DC/DC converters. A plurality of DC/AC converters can also be connected to these busbars, for example one DC/AC converter for each phase of the alternating current. Switches for connecting the individual current collector circuits and/or for connecting the DC/AC converter(s) to an output-side AC power grid and the like are frequently also present.

The current collector circuits of the photovoltaic system are also referred to as combiners or combiner boxes. The collector lines which run from them to the inverter are frequently referred to as homeruns. A small or even large number of strings of photovoltaic modules can be connected in parallel in a current collector circuit. Fuses and/or diodes for protecting against reverse currents, and sometimes also switches for connecting the individual strings are frequently also provided in the current collector circuits.

Occasionally the strings which are connected in parallel by a current collector circuit are individually also referred to as substrings, and only the totality of the substrings which are connected in parallel via a current collector circuit is then referred to as a string.

In the event of no DC/DC converter being connected between the strings and the DC/AC converter of the inverter, the voltage which is present between the string lines in the photovoltaic system is precisely as high as the voltage which is present between the collector lines and also as high as the voltage present between the busbars of the inverter. However, the strength of the current increases as a result of the parallel connections in the current collector circuits and the inverter. The constant voltage typically lies in the range of several hundred to a few thousand volts, with relatively high voltages being associated with the advantage that relatively low current strengths and therefore also relatively low line cross sections are sufficient to conduct equal electrical power levels.

Arcs can occur owing to insulation faults of the insulation between the string lines of each string, between the collector lines of each pair of collector lines and between the busbars of the inverter as well as between each of these lines and busbars with respect to ground or components of the photovoltaic system which are at ground potential. The arcs which occur between the string lines, the collector lines or the busbars of the inverter or between one of these lines and ground are usually referred to as parallel arcs. In addition to the parallel arcs, an arc can also occur within one of the specific lines or at the electrical connection thereof to another line of the same electrical potential, and said arc is then referred to as a series arc. The cause of a series arc can be, for example, locally limited damage to the line or an increased contact resistance at an electrical connection to the line. A defective, e.g. incorrectly opening, switch can also bring about an arc across its contacts. Both types of arcs—i.e. both parallel and series arcs—constitute a hazard potential in addition to the insulation faults themselves. Therefore, burning arcs can, for example, increase existing insulation faults and also cause other wide-ranging damage. This also includes causing a fire of the photovoltaic system. It is therefore important to detect arcs which occur in a photovoltaic system early, in order to be able to extinguish them and eliminate their causes.

In a known method and detection device, measured values of electrical variables are acquired at at least one of the string lines per string in the current collector circuits, and the measured values of the electrical variables are analyzed for the presence of signs of an arc in the photovoltaic system and arc signals which indicate the presence of an arc in the photovoltaic system are generated if the present signs of the arc meet predefined criteria. An arc fault circuit interrupter (AFCI) is activated with the arc signal. The electrical variables whose measured values are acquired for the arc detection are, for example, the DC voltage between the string lines, the DC voltage of the individual string lines with respect to ground potential, the DC current through the string lines or the high-frequency electrical interference spectrum which is emitted by an arc via the string lines. The acquisition of the measured values of the electrical variables frequently takes place here on a side facing the strings of a termination capacitor, provided in each current collector circuit, which makes available a low impedance for high-frequency modulations of the current, caused by the arc, through the affected string lines.

The known method and the known device for detecting arcs in a photovoltaic system are unsuitable for acquiring arcs which occur in or between the collector lines or busbars of the inverter or between the collector lines or busbars of the inverter and ground, since they do not have a significant effect on the electrical variables measured at the string lines, in particular if they occur on a side of the respective termination capacitor facing the inverter. However, shifting the measurement of the electrical variables toward the inverter would not overcome this problem, since there not only the voltage jumps and current jumps caused by an arc in the region of the string lines can remain very small compared to the rated voltage and the rated current, but also the voltage jumps and current jumps caused by an arc in the region of the collector lines which is further away from the inverter can remain very small compared to said rated voltage and rated current. When detecting arcs on the basis of the high-frequency electrical interference spectrum emitted by them, there is the need here to disconnect the high-frequency signal from the frequently very high direct currents. Decoupling means which are suitable for this, in the form of reactors and transformers quickly become disproportionally large and expensive in the case of large DC currents. In addition, such decoupling means cause undesired electrical losses. In addition, even when suitable decoupling means in the form of reactors and transmitters can still be implemented with an acceptable degree of expenditure for the DC currents which flow in the collector lines, the high-frequency signal, to be detected, of the electrical interference spectrum on the side of the termination capacitor facing the inverter is strongly damped owing to the generally high inductance of the collector lines. The detection of a signal which is damped in such a way is possible only with difficulty owing to the low signal-to-noise ratio, and the information provided by downstream evaluation electronics which are complex in terms of their configuration is reliable only to a limited degree.

DE 196 17 243 A1 discloses a method and a device for measuring the distance of a cable fault at which an arc is burning from a switching or measuring station in a medium-voltage power grid. Here, the transit times of the electrical and/or acoustic signals, generated by the arc, in the cable are measured in the cable sections on both sides of the arc and the distances of the source of the fault from the ends of the cable section are calculated therefrom. This means that the signals which are generated by the arc itself are utilized. This involves both electrical pulses and structure-borne noise signals with a purely arbitrary signal profile. The profile of the signals generated by the arc is measured with a sensor, and after the conversion with a high-speed analog/digital converter, is stored as a digital signal in a memory. By filtering with a Fast Fourier Transformation and a correlation analysis it is possible to determine the exact time of the arrival of the signal which is emitted by the arc in the direction of the sensor. In order to acquire the structure-borne noise as an indication for an arc, a piezoceramic sound transducer is used.

EP 1 623 240 B1 also discloses that partial-discharge activities within an insulation of high-voltage conductors can also be detected by means of different methods, including chemical, acoustic and electrical methods. There is specific teaching to use sensors for the electrical detection of partial discharges electrically said sensors being embodied as capacitive, inductive or longitudinal voltage sensors.

DE 10 2010 026 815 A1 discloses a method and a device for determining the location of faults in cables which serve, in particular, for the transmission and distribution of electrical energy and are laid in the ground. An acoustic signal which is generated at a location of a fault in the cable, and is, in particular, a flashover noise or discharge noise triggered by an electrical pulse, is utilized. In order in this context to reduce the influence of superimposed interference noise which makes identification of the acoustic signal and therefore also determination of the location of the fault more difficult, a reception signal, which contains the acoustic signal generated at the location of the fault, is compared with stored signal patterns or features or feature sets of acoustic signals generated at a location of a fault, in order to identify the signal in the case of correspondence or a predetermined similarity with the signal patterns or features or feature sets.

SUMMARY

The disclosure includes a method for detecting arcs in a photovoltaic system and a detection device, with which method and detection device complete monitoring of the DC range of a photovoltaic system for the occurrence of arcs can be implemented with an acceptable degree of expenditure.

The method according to the disclosure for detecting arcs in a photovoltaic system with an inverter and with a plurality of current collector circuits connected in parallel with the inverter via collector lines wherein a plurality of strings of photovoltaic modules are connected in parallel with each current collector circuit via string lines is disclosed. The method comprises acquiring measured values of electrical variables (i) at at least one of the string lines of each string, and/or (ii) at at least one upstream collector line of each pair of upstream collector lines to which a plurality of strings are connected in parallel, and/or (iii) at at least one of the collector lines of each current collector circuit in the current collector circuits, acquiring measured values of acoustic variables (iv) at at least one collector line of each current collector circuit, and/or (v) at at least one current busbar assigned to the inverter, to which current busbar a collector line of each current collector circuit is connected. The method further comprises analyzing both the measured values of the electrical variables and the measured values of the acoustic variables for the presence of signs of an arc in the photovoltaic system, and generating an arc signal which indicates the presence of an arc in the photovoltaic system if the present signs of the arc meet predefined criteria.

The measured values of the acoustic variables on the at least one busbar which is assigned to the inverter and/or on one of the collector lines of each current collector circuit can be acquired centrally at the location of the inverter, in particular in the housing of the inverter. However, it is also possible for the measured values of the acoustic variables on the at least one collector line of each current collector circuit to be acquired near to, in particular within, the housing of the current collector circuit. If the measured values of the acoustic variables on the at least one collector line of each current collector circuit are acquired in or near to the inverter, additional acquisition of the measured values of the acoustic variables at the at least one current busbar assigned to the inverter can frequently be dispensed with because then an acoustic signal, which is generated, for example, in the current busbar, is acquired with sufficient strength also at the collector lines connected to this current busbar. Of course, it is also possible, and also advantageous in particular with respect to the most precise possible determination of the location of the arc within the photovoltaic system, to acquire the measured values of the acoustic variables both in each of the busbars assigned to the inverter and in all the collector lines of each current collector circuit.

In addition to acquiring measured values of electrical variables at the string lines or at the upstream collector lines which are present only optionally between the string lines and the collector lines and in parallel with which a plurality of strings are connected, or at the collector lines in the current collector circuits, measured values of acoustic variables, i.e. other variables, are acquired. If the acoustic variables are acquired in the inverter, these other variables are acquired additionally at another location than the electrical variables. Acoustic variables with which monitoring for arcs can be carried out are easier to acquire in the inverter than electrical variables owing to the large currents flowing in the inverter, and in particular said monitoring is possible without adverse effects from the large flowing currents and independently of the present current strength of these currents. When large currents are flowing, it is, however, not only easier to acquire the measured values of the acoustic variables than to acquire measured values of electrical variables, but the measured values of the acoustic variables are also easier to analyze for the presence of signs of an arc in the photovoltaic system, because they do not have a very high uninformative DC component imposed on them, as is the case for the measured values of the electrical variables.

The disclosure is therefore based on the realization that, in particular for lines in which high DC currents flow, monitoring for an arc can be carried out more efficiently and more easily by acquiring the acoustic variables generated by the arc than by acquiring the electrical variables of said arc. However, this does not rule out the possibility of there being lines at which both the acoustic and the electrical variables for monitoring arcs can be acquired expediently and also more acceptably in terms of expenditure. However, a tendency is apparent that monitoring arcs on a line on the basis of the acquisition of the acoustic variables generated by the arc becomes more advantageous as the strength of the current within the line increases compared to acquisition on the basis of the electrical variables generated by the arc.

The acoustic variables whose measured variables are acquired are the frequency and/or amplitude of sound vibrations. Arcs excite such sound vibrations in a characteristic fashion. The sound can be, in particular, structure-borne noise but also basically air-borne sound. If air-borne sound is measured in the inverter or in a current collector circuit, this is done, for example, in such a way that not only the air-borne sound in the inverter or the current collector circuit itself is acquired but also air-borne sound which is incident on the inverter or the current collector circuit from the surroundings is acquired.

Furthermore, it becomes apparent that by using the measured values of the acoustic variables, at least when the acoustic variables comprise frequency and/or amplitude of structure-borne noise vibrations which originate from collector lines, these collector lines also over relatively large distances over which they extend between the respective current collector circuit and the inverter can be monitored reliably for the occurrence of arcs. Customary collector lines have a sufficiently high conductivity for structure-borne noise, while they frequently exhibit a high degree of damping for the relevant information of electrical variables, for example owing to their line inductance.

Specifically, in the method according to the disclosure the acoustic variables whose measured values are acquired at the collector lines and/or at the current busbar or busbars can comprise frequency and/or amplitude of structure-borne noise vibrations of the respective collector line or current busbar.

Basically, the structure-borne noise vibrations of all the collector lines and both current busbars can be acquired. During the acquisition of the structure-borne noise vibrations of the current busbars, structure-borne noise vibrations of the collector lines which are connected thereto are also acquired when mechanical coupling is present. It is therefore possible, if only the structure-borne noise vibrations of the current busbars are acquired, to keep the acquisition expenditure overall very low. In contrast, by using the acquisition of the structure-borne noise vibrations of the collector lines it is possible to determine the location of a detected arc on the collector line of a specific current collector circuit and at the same time structure-borne noise vibrations of the current busbars are also acquired owing to the mechanical couplings. In order to set up a redundant detection of the occurrence of arcs, the respective structure-borne noise vibrations can be acquired both on all the collector lines and on both current busbars.

The electrical variables the measured values of which are acquired in the current collector circuits in the method according to the disclosure can comprise frequency and/or amplitude of currents through the respective string line or upstream collector line or collector line and/or frequency and/or amplitude of voltages between the respective string lines or upstream collector lines or collector lines and/or frequency and/or amplitude of voltages between one of the respective string lines, upstream collector lines or collector lines and ground. The criteria can be here the occurrence of current or voltage jumps in the DC components or high-frequency AC components in the currents or voltages.

The measured values of the electrical variables are, in one embodiment, acquired on a side, facing the strings, of a termination capacitor which acts between the string lines. The termination capacitor constitutes a defined low impedance for the high-frequency interference signal of an arc which burns in one of the strings or in the region of the string lines thereof. The termination capacitor can comprise here capacitors which are connected between the string lines of each string and/or between each pair of upstream collector lines and/or one or more capacitors which are connected between the collector lines. In the case of a termination capacitor which is made available with one or more capacitors between the collector lines it is sufficient to acquire the measured values of the electrical variables in the respective collector unit only at the collector lines. Stringwise decoupling of high-frequency interference signals is also possible and also advantageous with respect to better determination of the location of an arc, but is associated with greater expenditure and correspondingly higher costs.

In the method according to the disclosure, the predefined criteria with which present signs of an arc are compared can comprise a combination of signs of the arc in the case of the measured values of the electrical variables and the measured values of the acoustic variables. That is to say an arc can be detected not only by virtue of the fact that the signs in the measured values of the electrical variables or the signs in the measured values of the acoustic variables satisfy the predefined criteria. An arc can also be detected if the signs in the measured values of the electrical variables and the measured values of the acoustic variables each satisfy only relatively weak criteria, which are not sufficient per se, but in their total can be nevertheless considered to be sufficient for the presence of an arc. In this context, it is advantageous to set up a chronological correlation between measured values of the electrical variables and the acoustic variables—for example by means of time stamps of the respective measured values. The time stamps indicate the time of the acquisition of the respective measured values. An arc outputs both electrical and acoustic variables and signals starting from the time of its production. Because of its high propagation speed, the electrical signals are perceived at the location of the corresponding electrical sensors—in particular current sensors and/or voltage sensors—virtually simultaneously with their generation which possibly takes place at another location. In the case of the acoustic signals this is not the case owing to their much lower propagation speed even if the propagation speed of structure-borne noise is generally significantly above that of air-borne sound. The measured values of the acoustic variables are therefore mainly acquired only with a significant time offset after their production, depending on the location of the arc and the location of the acoustic sensors. If the measured values of both the acoustic variables and of the electrical variables are then provided with time stamps, the comparison of the measured values of the electrical and acoustic variables permits not only additional plausibility checking for the arc but also more precise determination of the location of the arc as far as a certain section of the respective line.

A detection device according to the disclosure for arcs in a photovoltaic system with an inverter and with a plurality of current collector circuits connected in parallel with the inverter via collector lines, wherein a plurality of strings of photovoltaic modules are connected in parallel with each current collector circuit via string lines comprises at least one electrical sensor in each current collector circuit, which acquires measured values of electrical variables at at least one of the string lines of each string, and/or at at least one upstream collector line of each pair of upstream collector lines to which a plurality of strings are connected in parallel, and/or at at least one of the collector lines of each current collector circuit. The detection device further comprises at least one acoustic sensor, which acquires measured values of acoustic variables at at least one collector line of each current collector circuit and/or at at least one current busbar assigned to the inverter, to which current busbar a collector line of each current collector circuit is connected, and at least one analysis circuit to which at least all of the sensors present in a current collector circuit are connected. All of the electrical and acoustic sensors can be connected to the at least one analysis circuit, which can be designed to analyze the measured values of the electrical variables and the measured values of the acoustic variables for the presence of signs of an arc in the photovoltaic system and to generate an arc signal which indicates the presence of an arc in the photovoltaic system if the present signs of the arc meet predefined criteria.

A plurality of separate analysis circuits can also be provided, wherein the electrical sensors are connected to an analysis circuit in each collector unit, and the at least one acoustic sensor is connected to a further analysis circuit. Correspondingly, the analysis circuit in each collector unit then analyzes only the measured values of the electrical variables from each collector unit for the presence of signs of an arc, while the further analysis circuit which is arranged, for example, in the inverter analyzes the measured values of the acoustic variables. An arc signal which indicates the presence of an arc in the photovoltaic system is then generated by each of the analysis circuits if the signs of the arc which are available to it meet the predefined criteria.

However, if a common analysis circuit is provided for analyzing the measured values of the electrical variables and the measured values of the acoustic variables, the analysis circuit can also be designed to generate the arc signal if the present signs of the arc meet predefined criteria, which comprise a combination of signs of the arc in the case of the measured values of the electrical variables and the measured values of the acoustic variables. A common analysis circuit is advantageous, in particular, when the measured values of the acoustic and/or of the electrical variables are provided, by the sensors which acquire them, with time stamps which indicate the time of their acquisition, and these time stamps are analyzed in addition to the actual measured values of the acoustic and electrical variables, for example with respect to additional plausibility checking or more precise determination of the location of the arc.

In the detection device according to the disclosure, the at least one acoustic sensor is, in particular, a structure-borne noise sensor. If in fact just a single acoustic sensor is provided, in one embodiment it acquires the frequency and/or amplitude of structure-borne vibrations of the current busbar to which one collector line from each current collector circuit in the inverter is connected. Alternatively or additionally, acoustic sensors in the form of structure-borne noise sensors in the device according to the disclosure can acquire the frequency and/or amplitude of structure-borne noise vibrations of the at least one collector line of each current collector circuit. A structure-borne noise sensor is typically an acceleration sensor with which frequency and/or amplitude of structure-borne noise vibrations, e.g. vibrations of the corresponding body, are acquired directly on the body to be detected. In this context, the structure-borne noise sensor is advantageously connected directly to the body to be detected. However, use of a microphone as an acoustic sensor is alternatively or cumulatively conceivable. A microphone measures the structure-borne noise vibrations typically indirectly via a transmission medium, for example air. In this context, the structure-borne noise vibrations of the body to be detected typically excite acoustic sound waves in the transmission medium, which sound waves are passed on by the transmission medium to the microphone and are acquired thereby. In order to detect the structure-borne noise vibration, the microphone must therefore not be connected directly to the body to be detected. Instead, it is sufficient if the microphone is merely mounted in the vicinity of the body to be detected, in order to acquire the acoustic sound waves of the transmission medium without significant distance-induced damping.

The at least one electric sensor of the detection device according to the disclosure can comprise a current sensor, which acquires the frequency and/or amplitude of currents through the respective string line or upstream collector line or collector line, and/or a voltage sensor which acquires the frequency and/or amplitude of voltages between the respective string lines or upstream collector lines or collector lines and/or frequency and/or amplitude of voltages between one of the respective string lines, upstream collector lines or collector lines and the ground. It is also possible for the at least one voltage sensor to acquire the frequency and/or amplitude of voltages between a string line, an upstream collector line or a collector line and the ground.

A photovoltaic system according to the disclosure with an inverter and with a plurality of current collector circuits connected in parallel with the inverter via collector lines, wherein a plurality of strings of photovoltaic modules are connected in parallel with each current collector circuit via string lines, also has a detection device according to the disclosure.

Advantageous developments of the disclosure can be found in the patent claims, the description and the drawings. The advantages of features and of combinations of a plurality of features which are specified in the description are merely exemplary and can come into effect alternatively or cumulatively without the advantages necessarily having to be achieved by embodiments according to the disclosure. Without the subject matter of the appended patent claims being amended by this, the following applies with respect to the disclosed content of the original application documents and of the patent: further features can be found in the drawings—in particular the illustrated relative arrangement of a plurality of components, and the operative connection between them. The combination of features of different embodiments of the disclosure or of features of different patent claims is also possible in different ways than the selected back-references of the patent claims and is suggested herewith. This also applies to those features which are illustrated in separate drawings or specified in the description thereof. These features can also be combined with features of different patent claims. Features which are specified in the patent claims for further embodiments of the disclosure can likewise be dispensed with.

The features which are specified in the patent claims and the description are to be understood with respect to their number in such a way that precisely this number or a larger number than the specified number is present, without the need for an explicit use of the adverb "at least". Therefore, if, for example, one element is mentioned, this is to be understood as meaning that precisely one element, two elements or more elements are present. These features can be supplemented by other features, or be the only features from which the respective method, the respective detection device or photovoltaic system is composed.

The reference symbols contained in the patent claims do not constitute a restriction of the scope of the subject matters protected by the patent claims. They serve merely the purpose of making the patent claims easier to understand.

BRIEF DESCRIPTION OF THE FIGURES

In the text which follows, the disclosure will be explained and described further with reference to a preferred exemplary embodiment illustrated in the FIGURE.

FIG. 1 is a schematic view of a photovoltaic system according to the disclosure with a detection device according to the disclosure for arcs in the photovoltaic system.

DETAILED DESCRIPTION

In the photovoltaic system 1 illustrated schematically in FIG. 1, many details of a photovoltaic system which are familiar to a person skilled in the art but which are not of particular significance for the present disclosure are not illustrated. These include, for example, typically present switches and fuses. Furthermore, components of the photovoltaic system which are present multiply in a similar or even in the same way are indicated in their plurality only. In particular, the number of these multiply present components of the photovoltaic system 1 cannot be inferred from the FIGURE. Therefore, a multiplicity of a component indicated in FIG. 1 can be much greater than an indicated multiplicity of another component, without this being apparent from the FIGURE.

The photovoltaic system 1 according to FIG. 1 has an inverter 2. A plurality of current collector circuits 5 are connected in parallel to the inverter 2 via in each case a pair of collector lines 3, 4. A plurality of strings 6 with photovoltaic modules 7 which are connected in series are connected in parallel to each current collector circuit 5 via pairs of string lines 8 and 9. In the current collector circuits 5, the respective string lines 8 are connected to the respective collector line 3, and the respective string lines 9 are connected to the respective collector line 4. In this context, switches which are not illustrated here can be provided in order to connect the string lines 8, 9, e.g. in pairs, to the collector lines 3, 4. In a corresponding way, in the inverter 2 the collector lines 3 of the individual current collector circuits 5 are connected to a current busbar 10, and the collector lines 4 of the current collector circuits 5 are connected to a current busbar 11. A DC/AC converter 12, which converts the direct current generated by the photovoltaic modules 7 into an alternating current which it feeds, for example, into an AC power grid 13 is connected to the current busbars 10 and 11. Instead of just one DC/AC converter, a plurality of DC/AC converters can also be connected in parallel to the current busbars 10 and 11, for example one DC/AC converter per phase of a three-phase alternating current which is fed into the AC power grid 13. The number of current collector circuits 5 is typically smaller than the number of strings 6 per current collector circuit 5. However, this does not have to be the case. These numbers can also be the same, or more current collector circuits 5 than strings 6 can also be provided per current collector circuit 5.

In the photovoltaic system 1 illustrated by way of example in FIG. 1, no DC/DC converters are present between the strings 6 and the DC/AC converter 12. Owing to this, basically the same voltages occur between each pair of string lines 8 and 9, each pair of collector lines 3 and 4 and the current busbars 10 and 11. However, the strengths of the currents increase with each parallel connection of strings 6 and current collector circuits 5. The risk of arcs 14 occurring in the photovoltaic system 1 in the case of insulation faults between the conductors or with respect to ground is present everywhere as a result of the voltage which is of the same magnitude everywhere, and is typically several hundred to a few thousand volts. In addition to the arcs 14 which are described above and illustrated specifically in FIG. 1, and which can also be referred to as parallel arcs, there is also a risk of series arcs (not illustrated in FIG. 1) within a conductor, e.g. within a string line 8, 9 or a collector line 3, 4. The detection of any arcs 14, i.e. of both parallel arcs and series arcs, in the region of each pair of string lines 8 and 9 is carried out using at least one electrical sensor, here a current sensor 15 and a voltage sensor 16, which is provided here for the string lines 8 and 9 of each string 6. However, one current sensor 15 and/or one voltage sensor 16 are also sufficient for each of a plurality of pairs of optional upstream collector lines (not illustrated in FIG. 1) to which a plurality of strings 6 are respectively connected and which are connected in parallel to the collector lines 3, 4, or even a current sensor 15 and/or a voltage sensor 16 for the collector lines 3, 4 of each current collector circuit 5. In any case, all the current sensors 15 and voltage sensors 16 are arranged on a side, facing the strings, of a termination capacitor 31 in the respective current collector circuit 5 which is formed by a capacitor connected between the collector lines 3 and 4, and which makes available a low impedance for arcs 14 in the region of the strings 6 and their string lines 8 and 9. The current sensors 15 and the voltage sensors 16 can provide the measured values of electrical variables acquired by them with time stamps which indicate the times at which the individual measured values have been acquired.

When an arc 14 occurs, there are significant jumps in the current through and the voltage between the string lines 8 and 9 and/or there are high-frequency fluctuations in the current or the voltage which are acquired with the respective current sensor 15 or voltage sensor 16. The measured values 18 and 19, which are possibly provided with time stamps, of the electric sensors are analyzed for the presence of signs of an arc 14 in an analysis circuit 17. If these signs meet predefined criteria, the analysis circuit 17 outputs an arc signal 20. The arc signal 20 can initiate measures for extinguishing the arc and/or issue a warning message to the operator of the photovoltaic system 1.

However, arcs 14 in the region located behind the termination capacitors 31 of the collector lines 3 and 4 and of the busbars 10 and 11 are not reliably detected with the electrical sensors and the analysis circuit 17. Although basically electrical variables could also be measured here in order to detect any arcs 14, this proves increasingly costly owing to the increasing strength of the current because the signs of the presence of an arc in the measured values of the electrical variables have relatively high DC levels superimposed on them here. In addition, the sometimes high line inductances of the collector lines 3, 4 damp to a very great extent the high-frequency electrical signals which originate from arcs. In order to detect any arcs 14, structure-borne noise sensors 21 and 22 are therefore provided on the collector lines 3 and 4 as well as structure-borne noise sensors 23 and 24 on the current busbars 10 and 11. The structure-borne noise sensors 21 to 24 as specific embodiments of inventive acoustic sensors are all arranged in the inverter 2 in the embodiment illustrated in FIG. 1. At least the structure-borne noise sensors 21 and 22 could, however, advantageously also be arranged in the current collector circuits 5 because compared to the interior of the inverter 2 it is generally quieter there owing to less interference noise. The structure-borne noise sensors 21 to 24 can provide the measured values of acoustic variables acquired by them with time stamps which indicate the times at which the individual measured values have been acquired.

The structure-borne noise sensors 21 and 22 directly acquire structure-borne noise vibrations of the collector lines 3 and 4 and output measured values 25 and 26 relating to the frequency and amplitude of these structure-borne noise vibrations which are possibly provided with time stamps. The structure-borne noise sensors 23 and 24 acquire structure-borne noise vibrations of the current busbars 10 and 11 and therefore indirectly also structure-borne noise vibrations of the collector lines 3 and 4 and output measured values 27 and 28 which indicate the frequency and amplitude of the structure-borne noise vibrations of the current busbars 10 and 11. The measured values 25 to 28 are analyzed by an analysis circuit 29 which then outputs an arc signal 30 if signs of an arc 14 meet predefined criteria. The detection device for arcs in the photovoltaic system 1 therefore comprises the electrical sensors, for example the current sensors 15 and the voltage sensors 16, as well as the analysis circuit 17 in the individual current collector circuits 5 and the structure-borne noise sensors 21 to 24 and the analysis circuit 29. In the embodiment illustrated in FIG. 1, the structure-borne noise sensors 21 to 24 and the analysis circuit 29 are located in the inverter 2. However, in principle the illustrated positional assignment of the structure-borne noise sensors 21 to 24 as well as of the analysis circuits 17 and 29 is only exemplary and is not to be understood in a limiting fashion. For example, some or even all of the structure-borne noise sensors 21, 22 for the collector lines 3, 4 can be arranged in the corresponding current collector circuits 5. In the case of the embodiment illustrated in FIG. 1, the individual sensors differ not only in respect of their location but also in respect of the variables for which they acquire measured values.

If only arcs 14 between the collector lines 3 and 4 are involved and arcs of individual collector lines 3 and 4 to ground as well as series arcs within the collector lines 3, 4 and the current busbars 10, 11 can be excluded, of the structure-borne noise sensors 21 to 24 it is necessary to provide only one of the structure-borne noise sensors 23 and 24, and/or also only the structure-borne noise sensors 21 or the structure-borne noise sensors 22 are sufficient. However, if arcs to ground as well as (series) arcs are also to be detected within the collector lines 3, 4 and the current busbars 10, 11, structure-borne noise sensors 23, 24 advantageously are also provided at least on the two current busbars 10, 11 or on all the collector lines 3, 4 connected thereto.

It proves advantageous that the structure-borne noise sensors 21 to 24 can be made of identical design owing to their measuring principle, independent of the electrical variables, for quite differently dimensioned inverters 2. In other words, they do not have to be configured differently for an inverter which is configured for relatively high power levels than for a converter 2 which is configured for relatively low power levels. Furthermore, it becomes apparent that the measured values 25 to 28 which are supplied by the structure-borne noise sensors 21 to 24 are suitable for reliably detecting both series and parallel arcs 14, and even in the case of very long collector lines 3 and 4. Overall, the detection device for arcs 14 of the photovoltaic system 1 according to FIG. 1 is therefore suitable for reliably detecting arcs 14 which occur at any locations on the photovoltaic system 1. In this context, the analysis circuits 17 and 29 can also be combined or cooperate in order to detect arcs 14 both by means of signs in the measured values 18 and 19 of the electrical sensors, for example the current sensors 15 and the voltage sensors 16 as well as by means of signs in the measured values 25 to 28 of the structure-borne noise sensors 21 to 24. In this case, the measured values 18, 19 of the electrical variables, the measured values 25 to 28 of the acoustic variables and/or the arc signals 20, 30 can be transmitted by means of a communication device (not illustrated in more detail)—for example by radio—between the analysis circuits 17 and 29 or between the current collector circuits 5 and the inverter 2.

According to FIG. 1, the detection device for arcs in a photovoltaic system according to the disclosure has been explained using the example of a photovoltaic system 1 which does not have any DC/DC converters between the string 6 and the DC/AC converter 12, and in which therefore basically identical voltages occur between each pair of string lines 8 and 9, each pair of collector lines 3 and 4 and the current busbars 10 and 11. The detection device according to the disclosure as well as the method according to the disclosure are, however, not limited to such a photovoltaic system but rather can also be applied in photovoltaic systems which have one or more DC/DC converters between the strings 6 and the DC/AC converter 12. Of course, in these photovoltaic systems there can be different voltages between the string lines 8 and 9, the collector lines 3 and 4 and the current busbars 10 and 11.

The invention claimed is:

1. A method for detecting arcs in a photovoltaic system with an inverter and with a plurality of current collector circuits connected in parallel with the inverter via collector lines, wherein a plurality of strings of photovoltaic modules are connected in parallel with each current collector circuit via string lines, comprising:
    acquiring measured values of electrical variables using one or more electrical sensors,
        at at least one of the string lines of each string, and/or
        at at least one upstream collector line of each pair of upstream collector lines to which a plurality of strings are connected in parallel, and/or
        at at least one of the collector lines of each current collector circuit of the plurality of current collector circuits,
    analyzing the measured values of the electrical variables for the presence of signs of an arc in the photovoltaic system using an analysis circuit,
    acquiring measured values of acoustic variables using one or more acoustic sensors,
        at at least one collector line of each current collector circuit, and/or
        at at least one current busbar assigned to the inverter, to which current busbar a collector line of each current collector circuit is connected, and
    analyzing the measured values of the acoustic variables for the presence of signs of an arc in the photovoltaic system using the analysis circuit, and
    generating an arc signal which indicates the presence of an arc in the photovoltaic system if the analyzed measured values of the electrical variables and/or the acoustic variables meet predefined criteria.

2. The method as claimed in claim 1, wherein the acoustic variables comprise frequency or amplitude, or both, of structure-borne noise vibrations of the respective collector line or current busbar.

3. The method as claimed in claim 1, wherein the electrical variables the measured values of which are acquired in the current collector circuits comprise:
frequency or amplitude, or both, of currents through the respective string line or upstream collector line or collector line, and/or
frequency or amplitude, or both, of voltages between the respective string lines or upstream collector lines or collector lines, and/or
frequency or amplitude, or both, of voltages between one of the respective string lines, upstream collector lines or collector lines and ground.

4. The method as claimed in claim 3, wherein the measured values of the electrical variables are acquired on a side, facing the strings, of a termination capacitor which acts between the string lines.

5. The method as claimed in claim 1, wherein the measured values of the electrical variables or the measured values of the acoustic variables, or both, are provided with time stamps which specify their time instant of acquisition.

6. The method as claimed in claim 1, wherein the predefined criteria comprise a combination of signs of the arc in the case of the measured values of the electrical variables and the measured values of the acoustic variables.

7. A detection device for arcs in a photovoltaic system with an inverter and with a plurality of current collector circuits connected in parallel with the inverter via collector lines, wherein a plurality of strings of photovoltaic modules are connected in parallel with each current collector circuit via string lines, comprising:
at least one electrical sensor in each current collector circuit, which acquires measured values of electrical variables
at at least one of the string lines of each string, and/or
at at least one upstream collector line of each pair of upstream collector lines to which a plurality of strings are connected in parallel, and/or
at at least one of the collector lines of each current collector circuit,
at least one analysis circuit to which at least all of the electrical sensors present in one current collector circuit are connected and which is configured to analyze the measured values of the electrical variables for the presence of signs of an arc in the photovoltaic system and to generate an arc signal which indicates the presence of an arc in the photovoltaic system if the present signs of the arc meet predefined criteria,
wherein the detection device also comprises at least one acoustic sensor which acquires measured values of acoustic variables,
at at least one collector line of each current collector circuit, and/or
at at least one current busbar assigned to the inverter, to which current busbar a collector line of each current collector circuit is connected,
wherein the at least one acoustic sensor is connected to a further analysis circuit and wherein the further analysis circuit is configured to analyze the measured values of the acoustic variables for the presence of signs of an arc in the photovoltaic system and to generate an arc signal which indicates the presence of an arc in the photovoltaic system if the present signs of the arc meet predefined criteria.

8. The detection device as claimed in claim 7, wherein the at least one acoustic sensor is a structure-borne noise sensor or a microphone, by means of which a frequency or an amplitude, or both, of structure-borne noise vibrations of the respective collector line or current busbar is acquired.

9. The detection device as claimed in claim 7, wherein the at least one electrical sensor comprises a current sensor, which acquires the frequency or amplitude, or both, of currents through the respective string line or upstream collector line or collector line, or in that the at least one electrical sensor comprises a voltage sensor, which acquires:
frequency or amplitude, or both, of voltages between the respective string lines or upstream collector lines or collector lines, and/or
frequency or amplitude, or both, of voltages between one of the respective string lines or upstream collector lines or collector lines and ground.

10. The detection device as claimed in claim 7, wherein each current collector circuit comprises a termination capacitor which acts between the string lines and in that the at least one electrical sensor acquires the measured values of the electrical variables on a side, facing the strings, of the termination capacitor.

11. The detection device as claimed in claim 7 in combination with a photovoltaic system with an inverter and with a plurality of current collector circuits connected in parallel with the inverter via collector lines, wherein a plurality of strings of photovoltaic modules are connected in parallel with each current collector circuit via string lines.

12. A detection device for arcs in a photovoltaic system with an inverter and with a plurality of current collector circuits connected in parallel with the inverter via collector lines, wherein a plurality of strings of photovoltaic modules are connected in parallel with each current collector circuit via string lines, comprising:
at least one electrical sensor in each current collector circuit, which acquires measured values of electrical variables,
at at least one of the string lines of each string, and/or
at at least one upstream collector line of each pair of upstream collector lines to which a plurality of strings are connected in parallel, and/or
at at least one of the collector lines of each current collector circuit,
an analysis circuit to which all of the electrical sensors are connected and which is configured to analyze the measured values of the electrical variables for the presence of signs of an arc in the photovoltaic system and to generate an arc signal which indicates the presence of an arc in the photovoltaic system if the measured values of the electrical variables meet predefined criteria,
wherein the detection device also comprises at least one acoustic sensor which acquires measured values of acoustic variables,
at at least one collector line of each current collector circuit, and/or
at at least one current busbar assigned to the inverter, to which current busbar a collector line of each current collector circuit is connected,
wherein the one acoustic sensor is connected to the analysis circuit and wherein the analysis circuit is configured to also analyze the measured values of the acoustic variables for the presence of signs of an arc in the photovoltaic system and to generate an arc signal which indicates the presence of an arc in the photovoltaic system if the measured values of the acoustic variables meet predefined criteria.

13. The detection device as claimed in claim 12, wherein the analysis circuit is configured to generate the arc signal if the present signs of the arc meet predefined criteria, which comprise a combination of signs of the arc in the case of the measured values of the electrical variables and the measured values of the acoustic variables.

14. The detection device as claimed in claim 13, wherein the at least one electrical sensor provides the measured values of the electrical variables with time stamps which specify their instant of acquisition, or the at least one acoustic sensor provides the measured values of the acoustic variables with time stamps which specify their instant of acquisition, or both.

15. The detection device as claimed in claim 14, wherein the analysis circuit takes into account the time stamps of the measured values of the electrical variables or the measured values of the acoustic variables in the combination of signs of the arc, or both.

16. The detection device as claimed in claim 12, wherein the at least one acoustic sensor is a structure-borne noise sensor or a microphone, by means of which a frequency or an amplitude, or both, of structure-borne noise vibrations of the respective collector line or current busbar is acquired.

17. The detection device as claimed in claim 12, wherein the at least one electrical sensor comprises a current sensor, which acquires the frequency or amplitude, or both, of currents through the respective string line or upstream collector line or collector line, or in that the at least one electrical sensor comprises a voltage sensor, which acquires:
- frequency or amplitude, or both, of voltages between the respective string lines or upstream collector lines or collector lines, and/or
- frequency or amplitude, or both, of voltages between one of the respective string lines or upstream collector lines or collector lines and ground.

18. The detection device as claimed in claim 12, wherein each current collector circuit comprises a termination capacitor which acts between the string lines and in that the at least one electrical sensor acquires the measured values of the electrical variables on a side, facing the strings, of the termination capacitor.

19. The detection device as claimed in claim 12 in combination with a photovoltaic system with an inverter and with a plurality of current collector circuits connected in parallel with the inverter via collector lines, wherein a plurality of strings of photovoltaic modules are connected in parallel with each current collector circuit via string lines.

* * * * *